United States Patent [19]

Berger

[11] 4,100,573
[45] Jul. 11, 1978

[54] THERMAL IMAGING TRANSDUCER AND SYSTEM

[76] Inventor: J. Louis Berger, 8614 Camden St., Alexandria, Va. 22308

[21] Appl. No.: 724,487

[22] Filed: Sep. 20, 1976

[51] Int. Cl.² .............................................. H04N 5/33
[52] U.S. Cl. ..................................... 358/113; 358/209
[58] Field of Search ....................... 358/113, 201, 209; 351/30; 250/338, 330

[56] References Cited

U.S. PATENT DOCUMENTS 3,846,820  11/1974  Lampe et al. ..................... 358/113 X Primary Examiner—Richard Murray
Attorney, Agent, or Firm—Nathan Edelberg

[57] ABSTRACT

A wedge of ferroelectric material is used as a thermal imaging transducer by plating a multiplicity of signal generating electrodes to the surface of the ferroelectric wedge. The wedge is electronically polarized using a descending voltage and thermal images are read out of the transducer using an ascending voltage ramp of opposite polarity from the polarizing voltage. Readout is obtained without requiring mechanical panning or thermal image interruption even if the subject is stationary.

7 Claims, 4 Drawing Figures

THERMAL IMAGING TRANSDUCER AND SYSTEM

GOVERNMENT USE

The invention described herein may be manufactured, used, and licensed by or for the Government for Governmental purposes without the payment to me of any royalties thereon.

BACKGROUND OF INVENTION

This invention relates to a thermal imaging system incorporating a wedge shaped ferroelectric transducer of the variety disclosed and claimed in U.S. Pat. No. 3,866,189 as the image sensing element. In particular, this invention utilizes a heretofore unrecognized thermal sensitivity characteristic of the wedge shaped ferroelectric transducer by modification of the surface of the transducer facing the thermal source such that discrete portions of that surface are individually responsive to the thermal source. Thus this invention may be considered an improvement over the invention disclosed and claimed in U.S. Pat No. 3,866,189. As in the preceding invention, it is the saturation level state of the square hysteresis loop material which affords useful information and, as in the preceding invention, a ramp voltage readout technique is employed to obtain the saturation level state information. In this instance, thermal energy exposure of the ferroelectric transducer alters the saturation level state. There are numerous applications where it is desirable to detect an image thermally where large volume or short lived transducers are unusable. Additionally, there are applications where it may be required to detect an object's general shape and motion along one or two axes, such as for use on an assembly line, but without the attendant complexity and cost of a complete vidicon system.

Therefore, a need has been created for a small, long lived thermal imaging transducer and system which is not complex. This invention is of a ferroelectric thermal imaging transducer and system which can detect either a moving or stationary object and generate a time varying voltage indicative of the general shape and motion along one or both axes. At least 250 bits of thermal information can be readout from this transducer if the ferroelectric is 10.5 millimeters in length, and configured as a single axis device.

If the ferroelectric is built in a two axes configuration, 2 centimeters by 1 centimeter, at least 1000 bits of thermal information can be readout in a 50 by 20 bit grid.

Although ferroelectric devices have been used in the past to operate as image transducers, they have required either a collimated polarized light beam and photoconductive coating, or else had to be used as a target in an evacuated cathode ray tube. Both these methods are relatively bulky, or have relatively short lives. Pyrolectric vidicons, to be workable, must be panned or else have a shutter interrupt the thermal energy source. The present invention does not require any such artifact.

What I have discovered is that there is a method to read thermal imaging information out of a ferroelectric chip, yet use only two electrical connections or, at most, three, and do this is a very small volume.

The readout can be effected without recourse to cathode ray tubes, collimated polarized light or panning or image interruption. Accordingly, it does not need mechanical devices for panning or interrupting.

Further, I have devised an electronic technique which, when used in conjunction with the transducer, can selectively readout those portions of the field of view desired.

SUMMARY OF INVENTION

In view of the above, it is an object of this invention to provide a transducer system which will convert a thermal image on one or two axes to a series train of electrical pulses that can be readout on two or, at most, three wires.

It is a further object of this invention to provide a transducer system which will be responsive to a thermal image whether or not it is in motion.

It is a still further object of this invention to provide the electronic technique necessary to enable the image to be readin and to be able to readout the electrical signal.

It is another object of this invention to selectively condition the transducer so as only a portion(s) of the image need to be readin, so as readout will be of the selected portion(s) only.

It is still another object of this invention to readout the selected portion of the image at a faster or slower rate and thereby effect compression or expansion of the readout.

It is yet a further object of this invention to readout the information and yet require no mechanical panning of the scene nor interruption of the image.

It is yet another object of this invention to provide a sensor from which the position, direction and velocity of the target can be ascertained by comparing the pulse train with a target present to a pulse train with no target present in an external memory circuit.

The invention for carrying out these objects comprises a segmented wedge of either crystalline or ceramic ferroelectric material used as the transducer, such as Bismuth Titanate or PLZT, means responsive to infrared radiation for varying the pyroswitching constant to corresponding levels, which is the constant relating the coercive field to temperature, means for electronically polarizing the transducer using a descending voltage so as to be able to read the thermal signal in, means to electrically read the signal out of the transducer using an ascending voltage ramp of opposite polarity from the polarizing voltage, means for readout of selective readin, means for compressing or expanding the time for readout and means to effect readout without requiring mechanical panning or image interruption.

DESCRIPTION OF DRAWINGS

The present invention is illustrated in the accompanying drawings wherein.

DETAILED DESCRIPTION

Figure 1:
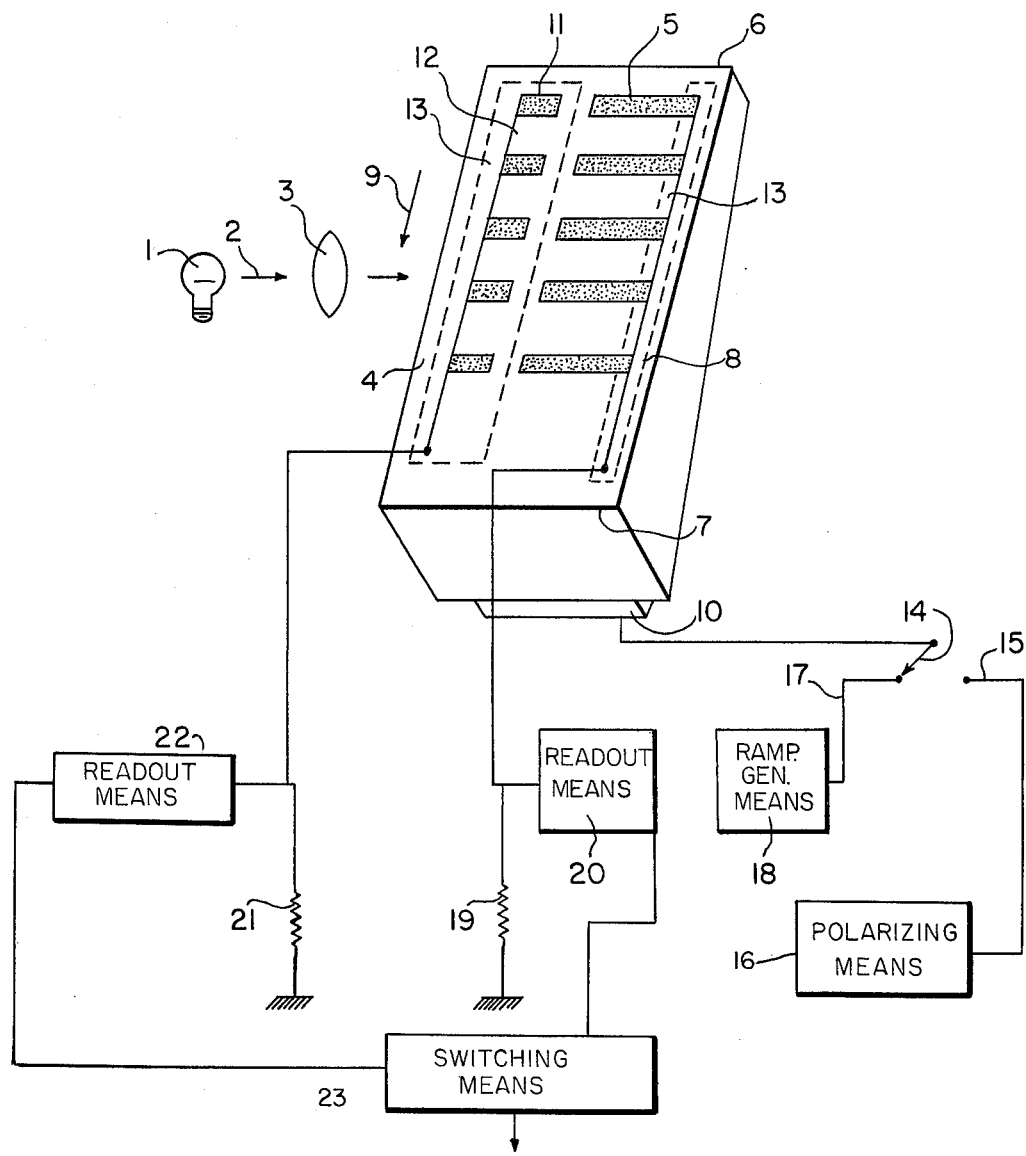
FIG. 1 is a perspective view and block diagram of the thermal imaging transducer and electronics of the subject invention, in a single axis scan.

With the present invention, the thermal energy from any source, shown diagrammatically in FIG. 1 by the energy source 1 and beam 2, passes through a lens 3 and onto the single axis transducer 4. The transducer, consisting of a ferroelectric crystal or ceramic has a pyroswitching capability. Therefore, as is well known, its coercive field is a function of temperature. As can be seen in FIG. 1, the transducer thickness is wedge shaped and has a multiplicity of electrodes 5 plated on the surface.

The electrodes 5 are parallel to each other and to the thin edge 6 and thick edge 7 of the ferroelectric. They are all connected together by busbar 8. The thermal image, in impinging upon the ferroelectric, causes each segment of the wedge to take on a different coercive field dependent on the thermal illumination. As will be shown later, it is by reason of the varying wedge thickness that readout of this information along a single axis 9 by a ramp voltage is possible.

On the bottom side of the wedge, a common electrode 10 is plated so that it is directly below electrodes 5, but is not located below busbar 8. This eliminates any possible signal being generated at the busbar due to thermal energy. Electrode 10 also serves as the common input electrode below electrodes 11. Electrodes 11 are plated co-linearly with electrodes 5, and connected by busbar 12. The common electrode 10 is placed so that it is also directly below electrodes 11 but not below busbar 12. The placement eliminates any possible common output signal from the busbar.

Above the electrodes 11 and busbars 12 and 8 is an opaque coating 13 which effectively shields them from the thermal radiation, so as to prevent spurious pickup.

Electrodes 11 are used to generate the timing waveform necessary for pulse position demodulation techniques by providing a reference pulse for each co-linear signal segment 5.

Switch 14 in position 15 connects common electrode 10 to either the electronics 16 necessary to polarize the wedge prior to readout, or in position 17, to the electronics 18 necessary to generate the waveforms that allow the readout signal to appear at electrodes 5 and the reference signal to appear at electrodes 11.

The polarizing electronics 16 can polarize all or selectively polarize any portion or portions of the ferroelectric wedge in one direction. To polarize all of the wedge, it is necessary that a sufficiently high potential be applied for a sufficient time to saturate the thickest portion of the wedge.

Since the polarization of a ferroelectric is both time and voltage dependent, it can be appreciated that various combinations will suffice. Typically, 200 volts across a Bismuth Titanate wedge with a maximum thickness of 0.4 millimeters for a period of more than 1 millisecond is adequate.

Since the time-voltage relationship is exponential, a small decrease in potential can increase the time required to excessive amounts. As an example, if instead of a field strength of 4.3 kv/cm, only a 4 kv/cm were applied, the switching time would increase from 1 millisecond to approximately 10 seconds.

After the wedge is polarized, switch 14 is operated to position 17 for readout. The generator electronics 18 provides an increasingly positive voltage ramp. This is of opposite polarity to the negative going waveform used to polarize the ferroelectric prior to readout.

The readout voltage output across resistor 19 as a function of time or applied readout ramp will also be a function of the intensity of the thermal image impinging on each segment. The moment in time that the domains on each segment reverse polarization will be dependent upon the value of the coercive field, which is, in turn, dependent upon the intensity of the thermal image on each segment. The detection signal is readout on electronics 20, while a reference pulse generated by the electrodes 11 across resistor 21 is readout on the associated electronics 22, both signals of which are fed via a switching mechanism to an indicator mechanism that may be audial such as an alarm or visual such as a two-dimensional display.

Figure 2:
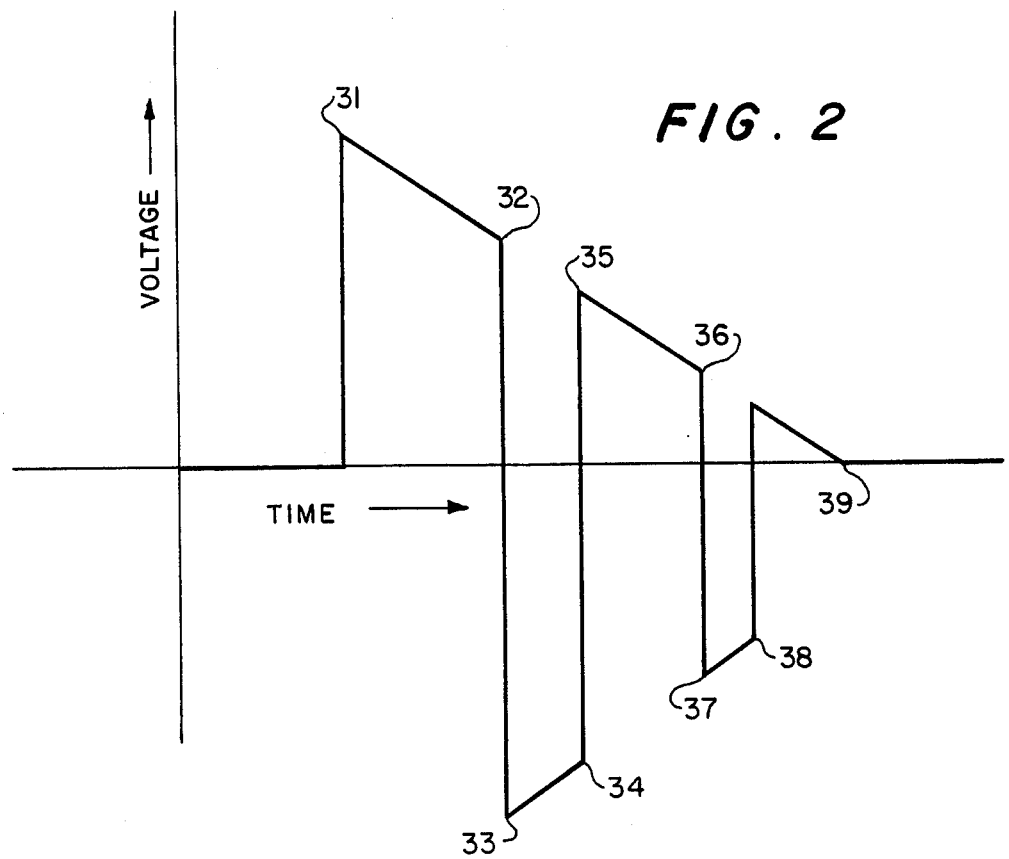
FIG. 2 depicts the polarizing waveform(s) and transducer polarization necessary for selective conditioning for readin if only certain portions of the image are to be subsequently readout.

The top portion of FIG. 2 depicts the polarizing waveform necessary if one or more portions of the wedge are to be selectively polarized downward. The bottom portion depicts the resultant polarization along the wedge. It is necessary to apply a descending ramp of voltage 31 to the wedge in series with a low value resistor, typically 1000 ohms, for polarization. At a voltage 32 corresponding to the position along the wedge to be polarized downward, the waveform polarity is reversed to 33. The ramp should be continued in a descending direction, but in the reversed polarity, until it reaches the voltage 34 corresponding to the end position to be polarized downward along the wedge. At this point the voltage should again be reversed to the original polarity 35, and continue descending. Notice that the reversed voltage between 33 and 34 is of greater absolute amplitude than just a reversed ramp. This greater amplitude allows for overcoming bias effects inherent in the ferroelectric.

If it is desirable to selectively polarize downwards more than one portion of the wedge, it is required that the descending ramp be reversed at other portions such as at 6. Note that by using a descending ramp rather than an ascending one, all of the wedge is polarized upwards at 1, but as the ramp decreases, it is only capable of being polarized downwards at thinner sections, such as between 3 and 4, and 7 and 8. If a negative polarity ascending ramp or square wave were to have been used, the entire ferroelectric would have assumed a downward polarization, disallowing selective polarization.

The readout ramp reverses the domains upwards starting from the thin edge of the wedge. The voltage necessary to polarize a segment upwards without thermal imaging will be different than with imaging. Accordingly, at different signal amplitudes, different voltages will be required to reverse the polarization of a given segment. Thus, due to the transducer being wedge shaped, and due to an ascending ramp of voltage being applied to a previously polarized transducer, readout as a function of image intensity can be accomplished.

If the readout ramp velocity is increased, the readout can be obtained at a quicker rate, with an attendent beneficial increase in output voltage. More than a 1000 to 1 ratio can be achieved. Note that, even if the image does not move, the segments can be readout repetitively, without requiring panning or interruption of the image. In fact, position, direction, and velocity (if any) of the subject sensed can be ascertained by comparing the pulse train with a subject present to a reference pulse train representative of no subject being present. The reference pulse train may be created by a stored reference signal in an external memory.

Figure 3:
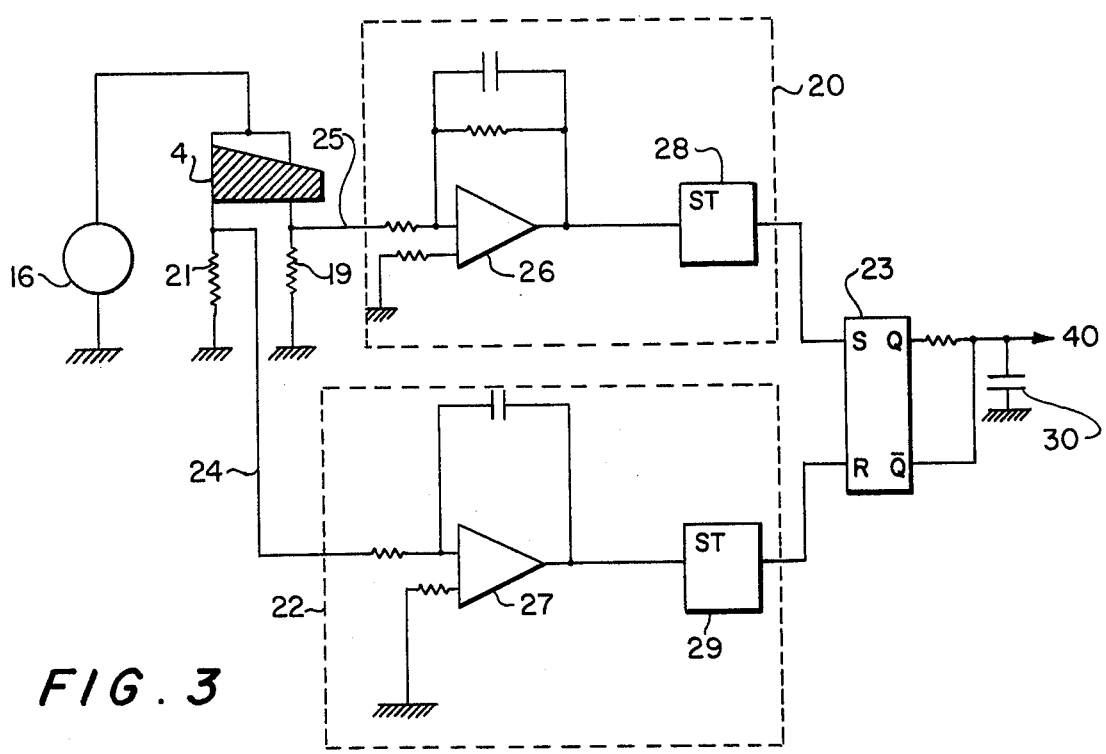
FIG. 3 is a schematic showing the electronics necessary for readout using the reference electrodes on the transducer for a pulse position demodulation reference.

FIG. 3 diagrams an electronic circuit to provide for polarizing the wedge prior to readout, where 4 represents schematically the ferroelectric wedge with a set of reference electrodes 5 and signal electrodes 11. The generator 16 provides either a square wave or the descending ramp of FIG. 2 to polarize both portions of the wedge, and is connected from ground to the common electrode of the wedge. The leads of reference electrodes 5 and signal electrodes 11 are connected through resistors 19 and 21 respectively, and the reference and signal taken off taps 24 and 25 respectively.

FIG. 3 also illustrates a typical electronic circuit which is suitable for readout of the signal from the transducer wedge 4. The ramp generator 16 impresses a rising ramp across the reference electrodes and the signal electrodes in series with their resistors 19 and 21 so as to obtain outputs. Each reference output across resistor 21 in the form of a pulse corresponding to each segment, goes through amplifier 27 and Schmitt trigger 29 and resets flip-flop 23, discharging capacitor 30.

With increasing image amplitudes, the signal output 25 from the wedge electrodes 5 is initiated more quickly in time compared to the reference output 24 from the ferroelectric 4. The signal pulse goes through amplifier 26 and Schmitt trigger 28 to set flip-flop 23.

This set pulse causes the capacitor 30 to start charging. Shortly later, the flip-flop, upon receiving a reference pulse from across resistor 21 resets, and discharges capacitor 30, to again await a set pulse derived from the signal across resistor 19. In this fashion, a serial signal is available at the integrator output 40 across capacitor 30 which is proportional to the image intensity at each segment, starting from the thin end of the wedge. This output 40 when fed to an indicator device which produces an audio or visual indication of the sensed objects, position, direction and/or velocity.

If pulse position techniques are not employed, the reference electrodes on the wedge can be eliminated, and an integrator circuit used without the Schmitt trigger and flip-flop. However, a variable gain amplifier would have to also be used to decrease the signal gain as the ramp increases in amplitude. The variable gain amplifier is needed so as to compensate for the increased signal attained with increased ramp amplitude. A stored reference signal would also be required.

Figure 4:
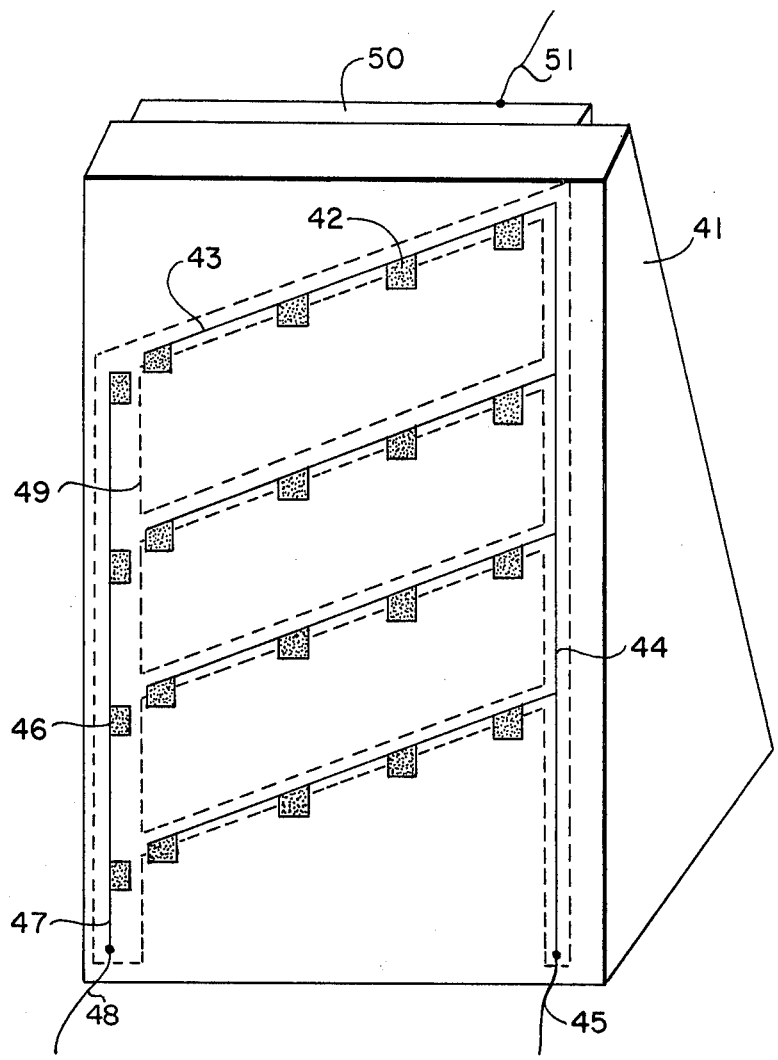
FIG. 4 illustrates an alternative electrode arrangement which may be used with the subject invention to provide a televisual type two axes scan rather than a single axis scan.

FIG. 4 illustrates a method by which a televisual scan may be created by utilization of the wedge. On wedge 41, signal electrodes 42 are plated along slanted busbars 43 so that no two electrodes are at the same thickness of dielectric, thereby assuring that a different field strength is required to polarize each one. This placement is easily accomplished by setting the busbars at a sufficient angle and making the electrodes sufficiently small. A thin busbar 44 connects each set of signal electrodes 42, and is brought out on wire 45.

Adjacent and colinear to each set of signal electrodes is an electrode 46 for use in obtaining a reference signal or as in the previous embodiment a stored reference signal in an external memory may be used. These reference electrodes 46 are interconnected by busbar 47 and brought out on a wire 48. On top of the reference electrodes 46 and the busbars 44 and 47 is an opaque coating 49 to eliminate spurious effects due to thermal energy. On the underside of the wedge is a common electrode 50, so placed as to lie under all signal and reference electrodes, but not under any busbars and brought out on wire 51.

In operation, this wedge is first polarized in the same fashion as the signal axis wedge 4 in the FIG. 1 embodiment, by using the waveform shown in FIG. 2 and the circuit of FIG. 3.

Readout is obtained in the same fashion as the single axis wedge. However, as the ramp voltage increases, it will first readout the signal electrodes from right to left on the busbar 63 nearest the thin edge of the wedge. The next signal electrode readout will be on the right edge of the second busbar 63 as it is at the next dielectric thickness. In this fashion, the entire wedge is readout in a manner that can be converted to a televisual display by any appropriate display media.

It is understood that the above described arrangements are only illustrative of the application of the principles of the invention. Various other arrangements and changes in geometry, details, materials and electronic circuitry described herein may be devised by those skilled in the art without departing from the spirit and scope of the invention and, accordingly, the invention should not be viewed as limited beyond the extent of the appended claims.

I claim:

1. A thermal imaging transducer system comprising a segmented wedge of ferroelectric material responsive to infrared radiation, means for polarizing said wedge using a descending voltage, means to electrically read a signal out of said wedge using an ascending voltage of a polarity the opposite of said descending voltage, such that the system will be responsive to a thermal image.

2. The thermal imaging transducer system of claim 1 wherein said means to electrically read a signal out of said wedge includes at least one set of thermal image responsive electrodes and a set of thermally shielded reference electrodes.

3. The thermal imaging transducer system of claim 2 wherein said thermal image responsive electrodes are mounted to said wedge in a transverse direction at spaced longitudinal points.

4. The thermal imaging transducer system of claim 2 comprising plural sets of thermal image responsive electrodes and wherein the image responsive electrodes are mounted at distinct longitudinal and lateral points upon the surface of said wedge such that and wherein said means to electrically read a signal out of said wedge is electrically connected to said image responsive electrodes.

5. The thermal imaging transducer system of claim 4 wherein both said responsive and reference electrodes are mounted to the same surface of said wedge.

6. The thermal imaging transducer system of claim 5 wherein said ferroelectric material is a material having discrete voltage level response to infrared radiation.

7. The thermal imaging transducer systems of claim 6 wherein said ferroelectric material is Bismuth Titanate.

* * * * *